(12) United States Patent
Theuss

(10) Patent No.: US 9,075,078 B2
(45) Date of Patent: *Jul. 7, 2015

(54) MICROELECTROMECHANICAL ACCELEROMETER WITH WIRELESS TRANSMISSION CAPABILITIES

(75) Inventor: Horst Theuss, Wenzenbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 273 days.

This patent is subject to a terminal disclaimer.

(21) Appl. No.: 13/241,665

(22) Filed: Sep. 23, 2011

(65) Prior Publication Data
US 2012/0073371 A1  Mar. 29, 2012

(30) Foreign Application Priority Data
Sep. 28, 2010  (DE) .......................... 10 2010 046 797

(51) Int. Cl.
| | | |
|---|---|---|
| *G01P 15/12* | (2006.01) | |
| *G01P 1/02* | (2006.01) | |
| *G01P 15/11* | (2006.01) | |
| *G01P 15/125* | (2006.01) | |
| *G01P 15/18* | (2013.01) | |
| *G01P 15/08* | (2006.01) | |

(52) U.S. Cl.
CPC .............. *G01P 15/123* (2013.01); *G01P 15/11* (2013.01); *G01P 15/125* (2013.01); *G01P 15/18* (2013.01); *G01P 2015/082* (2013.01); *G01P 2015/0865* (2013.01); *G01P 2015/0882* (2013.01); *H01L 2224/48091* (2013.01); *H01L 2224/48092* (2013.01); *H01L 2224/48227* (2013.01); *H01L 2924/1461* (2013.01)

(58) Field of Classification Search
USPC ................... 73/493, 514.31, 514.32, 514.33, 73/514.34, 431
See application file for complete search history.

(56) References Cited

U.S. PATENT DOCUMENTS

| | | | | |
|---|---|---|---|---|
| 4,553,436 | A | | 11/1985 | Hansson |
| 4,972,713 | A | * | 11/1990 | Iwata ............................... 73/654 |
| 5,211,051 | A | | 5/1993 | Kaiser et al. |
| 5,485,749 | A | * | 1/1996 | Nohara et al. ............. 73/514.33 |
| 5,548,999 | A | * | 8/1996 | Kakizaki et al. ................ 73/493 |
| 5,817,941 | A | * | 10/1998 | Stalnaker et al. ............... 73/493 |
| 6,112,594 | A | * | 9/2000 | Brinks et al. .................... 73/493 |
| 6,230,566 | B1 | * | 5/2001 | Lee et al. ................... 73/514.32 |
| 6,305,223 | B1 | * | 10/2001 | Matsumoto et al. ....... 73/514.32 |
| 6,810,736 | B2 | * | 11/2004 | Ikezawa et al. ................. 73/493 |
| 7,180,019 | B1 | * | 2/2007 | Chiou et al. ........... 200/61.45 R |
| 7,258,012 | B2 | * | 8/2007 | Xie .............................. 73/514.32 |
| 7,367,232 | B2 | * | 5/2008 | Vaganov et al. ........... 73/514.33 |
| 7,513,154 | B2 | * | 4/2009 | Ino ................................... 73/493 |
| 7,540,190 | B2 | * | 6/2009 | Sasaki ............................. 73/493 |
| 7,568,390 | B2 | * | 8/2009 | Shizuno ......................... 73/493 |
| 7,603,903 | B2 | * | 10/2009 | Ohta .......................... 73/504.12 |

(Continued)

OTHER PUBLICATIONS

Non-final Office Action dated Nov. 21, 2013 from the corresponding U.S. Appl. No. 13/241,333.

*Primary Examiner* — Helen Kwok

(57) ABSTRACT

In various embodiments, a microelectromechanical system may include a mass element; a substrate; a signal generator; and a fixing structure configured to fix the mass element to the substrate; wherein the mass element is fixed in such a way that, upon an acceleration of the microelectromechanical system, the mass element can be moved relative to the substrate in at least two spatial directions, and wherein a signal is generated by the movement of the mass element by means of the signal generator.

12 Claims, 2 Drawing Sheets

(56) References Cited

U.S. PATENT DOCUMENTS

| | | | |
|---|---|---|---|
| 2005/0217373 A1* | 10/2005 | Ishikawa et al. .............. 73/493 |
| 2005/0279166 A1 | 12/2005 | Shizuno | |
| 2010/0072626 A1 | 3/2010 | Theuss et al. | |
| 2012/0073372 A1* | 3/2012 | Theuss ..................... 73/514.35 |

* cited by examiner ated Sep. 28, 2010, and is incorporated herein by reference in its entirety.

MICROELECTROMECHANICAL ACCELEROMETER WITH WIRELESS TRANSMISSION CAPABILITIES

CROSS-REFERENCE TO RELATED APPLICATION

This application claims priority to German Patent Application Serial No. 10 2010 046 797.9, which was filed Sep. 28, 2010, and is incorporated herein by reference in its entirety.

TECHNICAL FIELD

Various embodiments relate to a microelectromechanical system, based on a chip carrier and a semiconductor chip connected thereto.

BACKGROUND

In so-called MicroElectroMechanical Systems MEMS, a movable part can be realized on a chip. Membranes used for static and/or dynamic pressure measurements, for example, are known here. In this case, the electrical measurement is preferably effected capacitively or piezoresistively. So-called structures anchored on one side, also known as "micro-springboards", are also known, which are often used as acceleration sensors. Other movable or oscillating systems are also known, as disclosed in US 2010/0072626, for example. In a "wafer-level packaged" integrated circuit, an MEMS is integrated in a first semiconductor layer. A thin-film layer is applied on the first semiconductor layer and arranged in such a way that it seals the cutout of the first semiconductor layer. At least one further layer is applied on the sealing thin-film layer and a so-called "under bump metallization" is arranged on the sealing thin film for the purpose of contact-connection. Such microstructures are very small since they are usually realized by etching processes on small semiconductor chips. Resulting from this, the correspondingly moved masses or volumes are very small. This fact restricts the deflection amplitudes and frequency ranges obtainable therewith such as natural oscillation properties and hence the spreading of such technologies in corresponding applications. Furthermore, it is hardly possible at the present time to measure movements and/or accelerations under the abovementioned boundary conditions in a plurality of spatial directions.

One possibility for solving this problem consists in using small membrane and tongue structures for fixing a mass to be accelerated, typically having thicknesses in the sub-µm range and up to 10 µm. The resulting lateral extents are thus in the range of <0.5 mm. The technologies used are usually etching and sacrificial technologies from microsystems engineering, also known as surface or bulk micromachining. Disadvantages here include, for example, the small mass, the small lateral extent of the movable parts of the corresponding structures and the fact that it is possible to measure corresponding accelerations only in one spatial direction.

SUMMARY

In various embodiments, a microelectromechanical system may include a mass element; a substrate; a signal generator; and a fixing structure configured to fix the mass element to the substrate; wherein the mass element is fixed in such a way that, upon an acceleration of the microelectromechanical system, the mass element can be moved relative to the substrate in at least two spatial directions, and wherein a signal is generated by the movement of the mass element by means of the signal generator.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
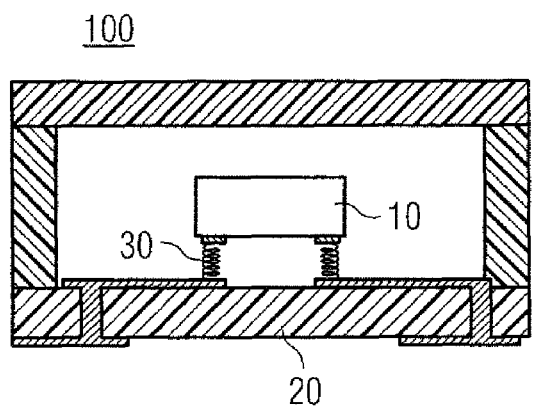
FIGS. 1a to 1c show various embodiments of an MEMS including "Spring Bumps"

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide an integrated MEMS which is measurement-sensitive.

Various embodiments of a microelectromechanical system include a mass element, a substrate, a signal generator and a fixing structure configured to fix the mass element to the substrate. In this case, the mass element may be fixed in such a way that, upon an acceleration of the microelectromechanical component, the mass element may be moved relative to the substrate in at least two spatial directions, and a signal is generated by the movement of the mass element by means of the signal generator. One advantage of various embodiments consists in the fact that exact accelerations may be measured on account of a relatively high mass of the mass element. In addition, various embodiment may afford the advantage that it is possible to measure accelerations and movements in at least two spatial directions virtually simultaneously.

In various embodiments, the mass element of the MEMS has a chip, wherein the chip is embodied as a signal detector and evaluator. One advantage may consist in the fact that the signal detector and evaluator itself serves as a mass element, as a result of the movement of which a signal may be generated. A corresponding signal may be generated in a simple manner by means of the mass of the chip. The chip may further comprise a transponder.

In various embodiments, the substrate of the MEMS forms a hollow body, and the chip may be arranged within the hollow body. One advantage of various embodiments may consist in the fact that the mass element may be fixed in the hollow body, and accelerations for example in all spatial directions can be measured.

In various embodiments of the MEMS, the signal generator may include magnetic coils for generating magnetic effects. By means of magnetic coils, signals may be generated by the movement of the mass element in a very simple manner by induction and may be forwarded to the corresponding evaluation device and processed.

In various embodiments of the MEMS, the signal generator may include electrodes for generating capacitive effects. By means of electrodes, signals may be generated capacitively and may be forwarded to the corresponding evaluation device and processed.

In various embodiments of the MEMS, the signal generator may include flexible and/or elastic connecting elements for generating piezoresistive signals. As a result of the movement of the mass element fixed to the substrate by means of the connecting elements, given the use of piezoresistive materials, preferably crystalline silicon, of the connecting elements, a piezoresistive signal may be generated and, in this embodiment, too, the generated signals may be forwarded to the corresponding evaluation device and processed.

In various embodiments of the MEMS, the fixing structure configured to fix the chip may include flexible and/or elastic contacts with spring-like properties. The use of such contacts makes it possible to realize a simple and cost-effective connection of the mass element to the substrate body. The mass element may oscillate upon acceleration and generate a signal.

In various embodiments of the MEMS, the fixing structure configured to fix the mass element may include elastic adhesive. Elastic adhesive is easy to process and suitable for producing flexible and/or elastic connections.

In various embodiments of the MEMS, the elastic adhesive at least partly fills the hollow body. The mass element may be movable in the adhesive, which is suitable as an elastic connecting element, and thus generate a signal. The mass element performs as it were a damped movement in the elastic adhesive.

In various embodiments of the MEMS, the fixing structure configured to fix the chip may include spring-like contacts, wherein the spring-like contacts may furthermore have a bent shape. Contacts shaped in this way are simple and cost-effective to produce.

Figure 1B:
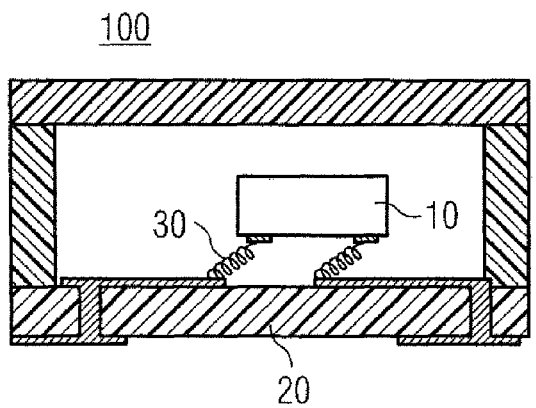

FIG. 1a shows an MEMS 100 including a chip 10 and a substrate 20. The substrate may be embodied in such a way that it forms a completely or else partly closed hollow body or cavity housing. The chip 10 is connected to the substrate 20 by means of flexible flip-chip contacts 30, also designated as "Spring-Bumps". The chip 10 is movable relative to the substrate 20 in at least two spatial directions. Consequently, the chip 10 also has a movable mass. Upon a movement, acceleration or else vibration of the MEMS 100, the chip 10 is moved relative to the substrate 20. As a result of the movement of the chip 10, shown in FIG. 1b, an electrical signal is generated by means of the provided signal generator 30. The electrical signal may be generated capacitively, inductively or else piezoresistively. A piezoresistive signal may in various embodiments be generated by a change in a resistance of the elastic contacts 30.

Figure 1C:
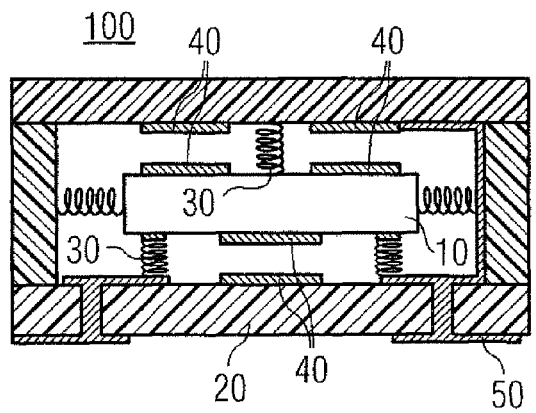

FIG. 1c likewise shows an MEMS 100 including a chip 10 and a substrate 20. In various embodiments, too, the substrate 20 may be embodied in such a way that it forms a completely or else partly closed hollow body. The MEMS may include electrodes 40, wherein electrical signals may be generated by the movement of the chip 10 by means of capacitive effects. Moreover, the MEMS may include magnetic coil pairs 40, wherein here, too, electrical signals may be generated by the movement of the chip 10 in the spatial directions by means of inductive effects. The MEMS may furthermore include flexible connecting means 40, which may in various embodiments generate piezoresistive signals upon movement of the chip 10. The MEMS likewise includes electrical conductor tracks 50 suitable for providing the generated electrical signal at suitable locations of the MEMS.

Figure 2A:
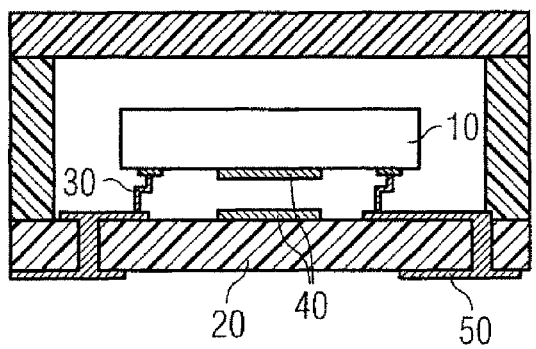
FIGS. 2a to 2b show various embodiments of an MEMS including elastic contacts.
Figure 2B:
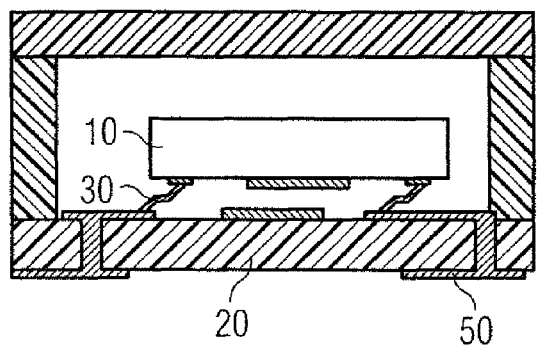

FIG. 2a shows an MEMS 300 including a chip 10 and a substrate 20. The chip 10 is connected to the substrate 20 by means of spring-like contacts 30. In the simplest case, the spring-like contacts 30 may be embodied as a bent leadframe lamina. In this embodiment, too, the chip 10 is movable relative to the substrate 20 in at least 2 spatial directions. Consequently, the chip 10 has a movable mass here, too. Upon a movement, acceleration or vibration of the MEMS 100, the chip 10 is moved relative to the substrate 20. As a result of the movement of the chip 10, shown in FIG. 2b, an electrical signal is generated by means of the provided signal generator 30. The signal generator 30 may have a configuration composed of electrodes or magnetic coils. The electrical signal may be generated capacitively or inductively. In various embodiments, too, the electrical signal may be provided by means of electrical conductor tracks 50 at suitable locations of the MEMS.

Figure 3A:
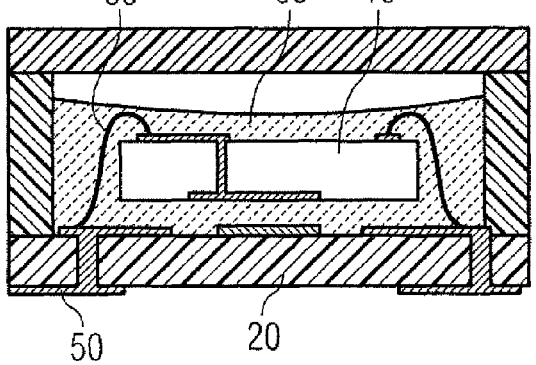
FIGS. 3a to 3b show various embodiments of an MEMS filled with elastic material.
Figure 3B:
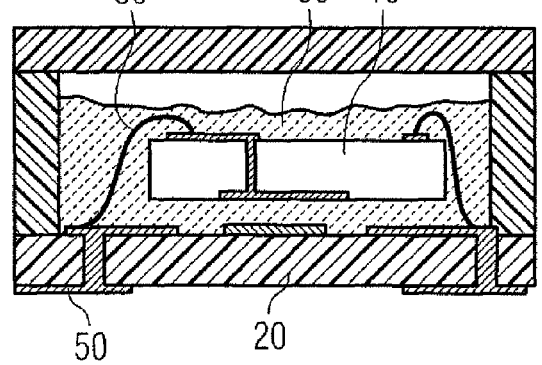

FIG. 3a shows an MEMS 400 including a chip 10 and a substrate 20. The chip 10 is connected to the substrate by means of bonding wires 30. In various embodiment, the substrate 20 is embodied in such a way that it forms a hollow body 400. The chip 10 is arranged in the substrate hollow body 20. In addition, the substrate hollow body 20 is at least partly filled with an elastic material 60. The chip 10 is arranged within the substrate hollow body in the elastic material and movable in at least 2 spatial directions. The elastic material may include an adhesive having different adhesive thicknesses, elastic and soft material properties. In various embodiments, too, upon a movement, acceleration or else vibration of the MEMS 400, the chip 10 is movable relative to the substrate 20, wherein the movement is damped by means of the elastic material, FIG. 3b. In this embodiment, too, electrical signals may be generated capacitively, inductively or piezoresistively and the electrical signal may be provided by means of electrical conductor tracks 50 at suitable locations of the MEMS.

Generally, all the embodiments mentioned may preferably be used in a wide variety of types of sensors, particularly in movement or acceleration sensors in which the movement or acceleration is intended to be measured in more than one spatial direction. Thus, by way of example, an electrical signal generated capacitively between a chip metallization and a substrate metallization can be tapped off. Inductive variants are conceivable if the sides of the chip and of the substrate which are moved relative to one another include a permanent-magnetic material or a coil. Systems for "Energy Harvesting", that is to say systems for obtaining energy, can thus also be realized. These systems convert, for example, the vibrations of the surroundings into electrical energy by way of movement of the chip 10. For example such "Energy Harvesting" applications, by means of the MEMS mentioned, are distinctly superior to the previously known traditional MEMS technologies in terms of their efficiency, on account of the higher masses and the detection of the movement or acceleration in at least two spatial directions.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A microelectromechanical system, comprising:
a mass element;
a substrate;
a signal generator; and
a fixing structure configured to fix the mass element to the substrate;
wherein the mass element comprises a chip with a signal detector and an evaluator;
wherein the mass element is fixed in such a way that, upon an acceleration of the microelectromechanical system, the mass element can be moved relative to the substrate in at least two spatial directions, and
wherein a signal is generated by the movement of the mass element by means of the signal generator.

2. The microelectromechanical system as claimed in claim 1, wherein the substrate forms a hollow body, and
wherein the mass element is fixed within the hollow body.

3. The microelectromechanical system as claimed in claim 1, wherein the signal generator comprises coils for generating magnetic effects.

4. The microelectromechanical system as claimed in claim 1, wherein the signal generator has electrodes for generating capacitive effects.

5. The microelectromechanical system as claimed in claim 1, wherein the signal generator comprises flexible connecting elements for generating piezoresistive signals.

6. The microelectromechanical system as claimed in claim 1, wherein the fixing structure configured to fix the mass element comprise elastic connecting elements.

7. The microelectromechanical system as claimed in claim 6, wherein the fixing structure configured to fix the mass element comprises at least one helical spring.

8. The microelectromechanical system as claimed in claim 6, wherein the fixing structure configured to fix the mass element comprises at least one bent leadframe lamina.

9. The microelectromechanical system as claimed in claim 1, wherein the fixing structure configured to fix the mass element comprises an elastic adhesive.

10. The microelectromechanical system as claimed in claim 9, wherein the elastic adhesive at least partly fills the hollow body.

11. The microelectromechanical system as claimed in claim 9, wherein the mass element is at least partly embedded in the elastic adhesive.

12. The electromechanical system of claim 1, wherein the chip has a transponder.

* * * * *